United States Patent
Bergmann et al.

(10) Patent No.: US 7,943,924 B2
(45) Date of Patent: May 17, 2011

(54) INDIUM GALLIUM NITRIDE-BASED OHMIC CONTACT LAYERS FOR GALLIUM NITRIDE-BASED DEVICES

(75) Inventors: Michael John Bergmann, Chapel Hill, NC (US); Daniel Carleton Driscoll, Raleigh, NC (US); David Todd Emerson, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 12/850,979

(22) Filed: Aug. 5, 2010

(65) Prior Publication Data

US 2010/0314640 A1    Dec. 16, 2010

Related U.S. Application Data

(63) Continuation of application No. 12/145,213, filed on Jun. 24, 2008, now Pat. No. 7,791,101.

(60) Provisional application No. 61/040,400, filed on Mar. 28, 2008.

(51) Int. Cl.
*H01L 29/06* (2006.01)

(52) U.S. Cl. ............ 257/11; 257/76; 257/189; 257/615; 257/E21.085; 257/E33.001

(58) Field of Classification Search .............. 257/11, 257/189, 200, 201, 615, 745, E21.085, E33.001, 257/13, 76, 78, 85, 90, 94–97
See application file for complete search history.

(56) References Cited

U.S. PATENT DOCUMENTS

| | | | |
|---|---|---|---|
| 6,078,064 A * | 6/2000 | Ming-Jiunn et al. ......... | 257/103 |
| 6,740,906 B2 | 5/2004 | Slater, Jr. et al. | |
| 6,791,119 B2 | 9/2004 | Slater, Jr. et al. | |
| 6,794,684 B2 | 9/2004 | Slater, Jr. et al. | |
| 6,888,167 B2 | 5/2005 | Slater, Jr. et al. | |
| 7,067,340 B1 | 6/2006 | Tsai et al. | |
| 7,087,931 B2 | 8/2006 | Wu et al. | |
| 7,132,695 B2 | 11/2006 | Ou et al. | |
| 7,183,586 B2 | 2/2007 | Ichihara et al. | |
| 7,211,833 B2 | 5/2007 | Slater, Jr | |

(Continued)

OTHER PUBLICATIONS

Jang et al. "Low-resistance and thermally stable indium tin oxide Ohmic contacts on strained $p\text{-}In_{0.15}Ga_{0.85}N/p\text{-}GaN$ layer" *Journal of Applied Physics* 101(1):013711-1-013711-4 (2007).

(Continued)

*Primary Examiner* — Evan Pert
*Assistant Examiner* — Scott Wilson
(74) *Attorney, Agent, or Firm* — Myers Bigel Sibley & Sajovec, P.A.

(57) ABSTRACT

Light emitting devices include a gallium nitride-based epitaxial structure that includes an active light emitting region and a gallium nitride-based outer layer, for example gallium nitride. A indium nitride-based layer, such as indium gallium nitride, is provided directly on the outer layer. A reflective metal layer or a transparent conductive oxide layer is provided directly on the indium gallium nitride layer opposite the outer layer. The indium gallium nitride layer forms a direct ohmic contact with the outer layer. An ohmic metal layer need not be used. Related fabrication methods are also disclosed.

16 Claims, 9 Drawing Sheets

U.S. PATENT DOCUMENTS

| | | |
|---|---|---|
| 7,274,040 B2 | 9/2007 | Sun |
| 2005/0173725 A1* | 8/2005 | Kunisato et al. ............... 257/103 |
| 2005/0184300 A1* | 8/2005 | Tazima et al. ................... 257/94 |
| 2006/0049417 A1 | 3/2006 | Li et al. |
| 2008/0283854 A1 | 11/2008 | Iza et al. |

OTHER PUBLICATIONS

Han et al. "The Effect of p-In-GaN layer on ITO based ohmic contacts to p-GaN", International Nano-Optoelectronics Workshop, 2007, i-NOW '07, Jul. 29, 2007-Aug. 11, 2007, pp. 90-91.

* cited by examiner

INDIUM GALLIUM NITRIDE-BASED OHMIC CONTACT LAYERS FOR GALLIUM NITRIDE-BASED DEVICES

CROSS-REFERENCE TO RELATED APPLICATIONS

This application is a continuation of U.S. patent application Ser. No. 12/145,213, filed Jun. 24, 2008 now U.S. Pat. No. 7,791,101, entitled Indium Gallium Nitride-Based Ohmic Contact Layers for Gallium Nitride-Based Devices, which itself claims the benefit of U.S. Provisional Application Ser. No. 61/040,400, filed Mar. 28, 2008, entitled Indium Nitride-Based Ohmic Contact Layers for Gallium Nitride-Based Devices, both of which are assigned to the assignee of the present application, the disclosures of both which are hereby incorporated herein by reference in their entirety as if set forth fully herein.

FIELD OF THE INVENTION

This invention relates to semiconductor devices, such as light emitting devices, and methods of fabricating same, and more particularly to ohmic contacts for gallium nitride-based devices and methods of fabricating same.

BACKGROUND OF THE INVENTION

Light emitting diodes and laser diodes are well known solid state electronic devices capable of generating light upon application of a sufficient voltage. Light emitting diodes and laser diodes may be generally referred to as light emitting devices ("LEDs"). Light emitting devices generally include a p-n junction formed in an epitaxial layer grown on a substrate such as sapphire, silicon, silicon carbide, gallium arsenide and the like. The wavelength distribution of the light generated by the LED generally depends on the material from which the p-n junction is fabricated and the structure of the thin epitaxial layers that make up the active light emitting region of the device.

Typically, an LED chip includes a substrate, an N-type epitaxial region formed on the substrate and a P-type epitaxial region formed on the N-type epitaxial region (or vice-versa). In order to facilitate the application of a voltage to the device, an anode ohmic contact is formed on a P-type region of the device (typically, an exposed P-type epitaxial layer) and a cathode ohmic contact is formed on an N-type region of the device (such as the substrate or an exposed N-type epitaxial layer). The ohmic contact may typically include an ohmic metal layer, such as platinum, palladium, nickel, titanium, gold, tin or combinations thereof. The ohmic metal layer is generally provided to reduce the forward or turn-on voltage of the device.

SUMMARY OF THE INVENTION

Light emitting devices according to some embodiments of the present invention include a gallium nitride-based epitaxial structure that includes an active light emitting region and a gallium nitride-based outer layer, for example binary gallium nitride. The active light emitting region may include multiple quantum well structures with indium gallium nitride-based wells. An indium gallium nitride-based layer is provided directly on the gallium nitride-based outer layer. In some embodiments, the indium gallium nitride-based layer has a higher percentage indium than the wells. A reflective metal layer is provided directly on the indium gallium nitride-based layer opposite the gallium nitride-based outer layer. However, in other embodiments, an ohmic metal layer is also provided between the indium gallium nitride-based layer and the reflective metal layer.

In some embodiments, the indium gallium nitride-based layer is undoped (i.e., not intentionally doped) and the gallium nitride-based outer layer is doped P-type. In other embodiments, the indium gallium nitride-based layer may be between about 5 Å and about 100 Å thick. In still other embodiments, the gallium nitride-based outer layer may include a nonplanar outer surface, and the indium gallium nitride-based layer is also nonplanar. In some embodiments, the reflective metal layer comprises silver, nickel-silver alloy and/or aluminum. Other embodiments also include a barrier layer on the reflective metal layer opposite the indium gallium nitride-based layer, and a bonding layer on the barrier layer opposite the reflective metal layer. Yet other embodiments may include a silicon carbide or other substrate on the gallium nitride-based epitaxial structure opposite the outer layer.

Light emitting devices according to other embodiments of the invention include a gallium nitride-based epitaxial structure that includes an active light emitting region and a gallium nitride-based outer layer, for example binary gallium nitride. The active light emitting region may include multiple quantum well structures with indium gallium nitride-based wells. An indium gallium nitride-based layer is provided directly on the gallium nitride-based outer layer. In some embodiments, the indium gallium nitride-based layer has a higher percentage indium than the wells. A transparent conductive spacer layer is provided directly on the indium gallium nitride-based layer opposite the gallium nitride-based outer layer. A reflective metal layer is provided directly on the transparent conductive spacer layer opposite the indium gallium nitride-based layer. Dopings, thicknesses, barrier layers, bonding layers, nonplanar layers and/or substrates may be provided as was described above. In some embodiments, the transparent conductive spacer layer may be sufficiently thick to space the active light emitting region apart from the reflective metal layer, so as to increase, and in some embodiments maximize, reflection of light from the reflective layer.

Light emitting devices according to yet other embodiments of the present invention include a gallium nitride-based epitaxial structure that includes an active light emitting region and a gallium nitride-based outer layer, for example binary gallium nitride. A binary indium nitride layer is provided directly on the gallium nitride-based outer layer. A reflective metal layer or a transparent conductive oxide layer is provided directly on the binary indium nitride layer opposite the gallium nitride-based outer layer. Accordingly, a binary indium nitride layer forms a direct ohmic contact with a gallium nitride-based outer layer. An ohmic metal layer need not be used, although it may be provided between the binary indium nitride layer and the gallium nitride-based outer layer in other embodiments.

In still other embodiments of the present invention, the reflective metal layer may comprise silver, nickel and/or aluminum, and the transparent conductive oxide layer may comprise indium tin oxide. Moreover, some embodiments may provide a barrier layer on the reflective metal layer opposite the binary indium nitride layer and a bonding layer on the barrier layer opposite the reflective metal layer. Other embodiments may provide a bond pad on the transparent conductive oxide layer opposite the binary indium nitride layer. Moreover, a silicon carbide or other substrate may be provided on the gallium nitride-based epitaxial structure opposite the outer layer.

Light emitting devices according to still other embodiments of the invention include a gallium nitride-based epitaxial structure that includes an active light emitting region. An indium gallium nitride-based layer including therein clusters of elemental indium and/or binary indium nitride is provided on the gallium nitride-based epitaxial structure. A reflective metal layer or a transparent conductive oxide layer is provided on the indium gallium nitride-based layer opposite the gallium nitride-based epitaxial structure. In some embodiments, the indium gallium nitride-based layer including therein clusters of elemental indium and/or binary indium nitride is an indium gallium nitride layer including therein clusters of elemental indium and/or binary indium nitride. Remaining layers in the device including the reflective metal layer, the transparent conductive oxide layer, the barrier layer, the bond pad and/or the substrate may be provided as was described above.

Embodiments of the present invention have been described above in connection with light emitting devices. However, analogous methods of forming light emitting devices may also be provided according to other embodiments of the present invention. In some embodiments, a gallium nitride-based structure that includes an active light emitting region and a gallium nitride-based outer layer, for example binary gallium nitride, may be epitaxially formed. An indium gallium nitride layer may be epitaxially formed directly on the outer layer. A reflective metal layer or a transparent conductive layer may be formed directly on the indium gallium nitride layer. The reflective layer may be formed by electron beam and/or sputter deposition without annealing, or a subsequent anneal may take place. The gallium nitride-based outer layer may be fabricated by exposing the gallium nitride-based structure to sources of gallium, nitrogen and a P-type dopant, and the indium gallium nitride layer may be formed by further exposing the gallium nitride-based structure to the sources of gallium and nitrogen, and to a source of indium, while terminating exposure to the P-type dopant. Other structures may be formed as described herein.

DETAILED DESCRIPTION

The present invention now will be described more fully with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. It will be understood that if part of an element is referred to as "outer," it is closer to the outside of the device than other parts of the element. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items and may be abbreviated as "/".

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the figures are schematic in nature and their shapes are not intended to illustrate the precise shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Various embodiments of semiconductor light emitting devices will be described herein. As used herein, the term "semiconductor light emitting device" may include a light emitting diode, laser diode and/or other semiconductor device which includes one or more semiconductor light emitting layers, which may include silicon, silicon carbide, gallium nitride and/or other semiconductor materials. A light emitting device may or may not include a substrate such as a sapphire, silicon, silicon carbide, aluminum nitride and/or other microelectronic substrate(s). A light emitting device may include one or more contact layers which may include metal and/or other conductive layers. In some embodiments, ultraviolet, blue and/or green light emitting diodes may be provided. Red and/or amber LEDs may also be provided. The design and fabrication of semiconductor light emitting devices are understood by those having skill in the art and need not be described in detail herein. For example, the semiconductor light emitting devices may be gallium nitride-based light emitting diodes or lasers fabricated on a silicon carbide substrate such as those devices manufactured and sold by Cree, Inc. of Durham, N.C.

Finally, when referring to a Group III nitride compound, the word "-based" means that additional Group III elements may be included in the compound. Thus, for example, a gallium nitride-based layer includes binary, ternary, quaternary, etc. compounds that include gallium nitride (GaN), and an indium gallium nitride-based layer includes quaternary and higher compounds that include indium gallium nitride (InGaN). In contrast, the terms "elemental", "binary", "ternary", "quaternary", etc. mean that additional Group III materials are not included in the compound. Thus, for example, binary gallium nitride excludes ternary, quaternary, etc. compounds, and ternary indium gallium nitride excludes quaternary, etc. compounds. However, all of the above defined terms do not preclude the Group III nitride compound from being doped P-type and/or N-type using, for example, P-type dopants such as magnesium and/or N-type dopants such as silicon.

Conventional LEDs based on Group III nitrides typically use an ohmic metal layer between the device layer and (1) a reflective metal layer in the case of flip-chip LEDs, or (2) a metal bond pad in the case of conventional (i.e., non-flip-chip) LEDs. The ohmic metal layer may include platinum, palladium, titanium, gold, tin or combinations thereof. Without the ohmic metal layer, the device may suffer from high forward or turn-on voltage (Vf).

Some embodiments of the present invention may arise from a recognition that, even though ohmic metal layers are generally used in light emitting devices, the ohmic metal layer still may produce an undesirably high forward voltage. Moreover, an ohmic metal layer may undesirably absorb at least some emission from the active layer, even if the ohmic metal layer is made very thin. Some embodiments of the present invention can eliminate the need for a separate ohmic metal layer, or can expand the range of metals that can form ohmic contacts to nitride-based devices. Moreover, embodiments of the invention may also be used with an ohmic metal layer to further reduce the forward voltage.

Some embodiments of the present invention can provide an indium nitride-based layer, such as an indium gallium nitride-based layer, directly on a gallium nitride-based outer layer, for example binary gallium nitride, and a reflective metal layer or a transparent conductive oxide layer directly on the indium nitride-based layer. The indium nitride-based layer, such as an indium gallium nitride-based layer, can provide a low bandgap contact layer that is undoped (i.e., not intentionally doped) or is intentionally doped N-type or P-type. For flip-chip mounting, a reflective metal layer may be provided directly on the indium nitride-based ohmic contact layer. For standard devices (i.e., non-flip-chip), there is no need to cover the surface of the indium nitride-based contact layer with a metal ohmic contact. In either case, forward voltage of the resulting device may be reduced, and light emission may be increased.

Stated differently, a reflective metal layer, such as silver, does not provide a good ohmic contact to conventional gallium nitride-based LEDs. However, some embodiments of the present invention provide an intermediate layer of indium nitride-based material, such as indium gallium nitride-based material, that can allow a good ohmic contact to be formed, so that the need for a separate ohmic metal layer may be eliminated. Moreover, when the indium nitride-based layer, such as the indium gallium nitride-based layer, is directly on a gallium nitride-based outer layer, for example binary gallium nitride, an even better ohmic contact may be provided.

Figure 1:
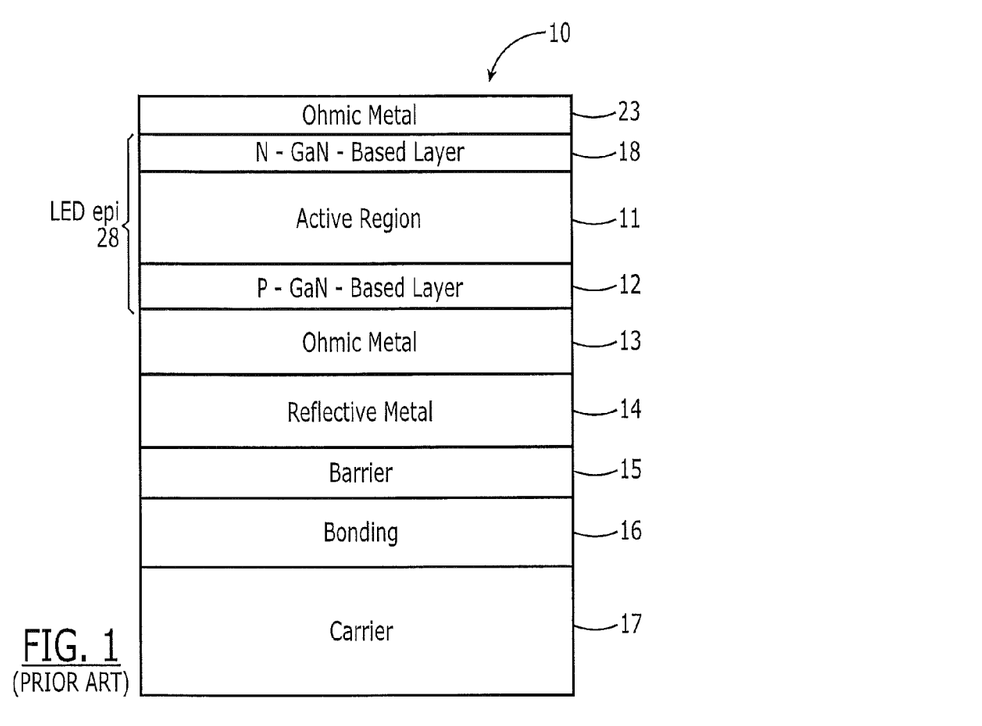
FIG. 1 is a cross-sectional view of a conventional flip-chip light emitting device mounted on a carrier such as a submount.

FIG. 1 is a cross-sectional view of a conventional flip-chip LED. As shown in FIG. 1, a conventional flip-chip LED 10 includes a gallium nitride-based epitaxial structure, also referred to as "LED epi" 28 that includes an active light emitting region 11, a gallium nitride-based outer layer 12 of, for example, binary gallium nitride that may be doped P-type, also referred to as a P—GaN-based layer and a gallium nitride-based layer 18 of, for example, binary gallium nitride that may be doped N-type, also referred to as an N—GaN-based layer. An ohmic metal layer 13 is provided on the P—GaN-based layer 12 and an ohmic metal layer 23 is provided on the N—GaN-based layer 18. The ohmic metal layers 13/23 may include platinum, palladium, nickel, titanium, gold, tin and/or combinations thereof. A reflective metal layer 14, for example comprising silver, nickel silver alloy and/or aluminum is provided on the ohmic metal layer 13. A barrier layer 15, comprising, for example, platinum, is provided on the reflective metal layer 14. A bonding layer 16, for example comprising gold, is provided on the barrier layer 15 and is used to bond the device to a carrier 17, such as a submount. A substrate may be provided on the active region 11 in some embodiments.

Figure 2:
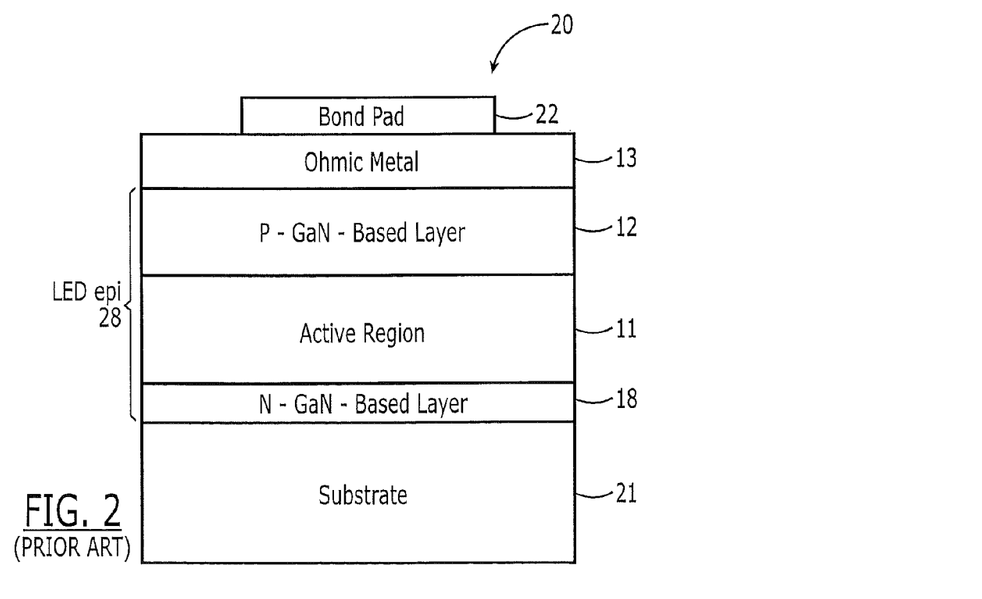
FIG. 2 is a cross-sectional view of a conventional non-flip-chip light emitting device.

FIG. 2 is a cross-sectional view of a conventional non-flip-chip LED 20 that includes a substrate 21, an LED epi region 28, including an active region 11, a P—GaN-based outer layer 12 and an N—GaN-based layer 18, as was described above, and an ohmic metal layer 13 as was described above. The ohmic layer 13 provides current spreading over the entire top surface of the device. A bond pad 22, such as a nickel/gold bond pad, is provided on the ohmic metal layer 13.

Figure 3:
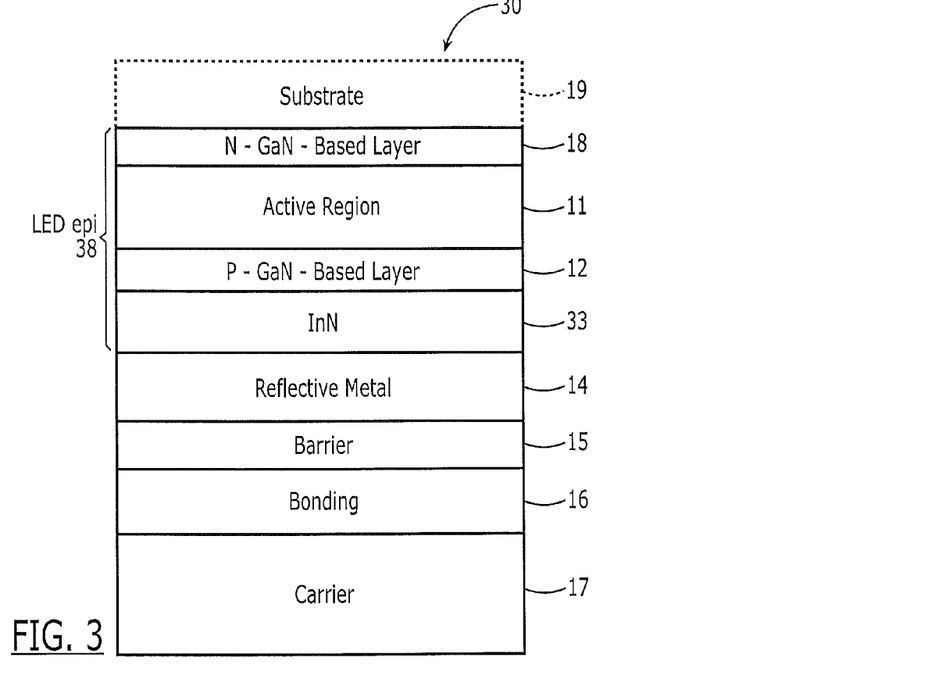
FIGS. 3 and 5 are cross-sectional views of flip-chip light emitting devices according to various embodiments of the present invention mounted on carriers such as submounts.

FIG. 3 is a cross-sectional view of a flip-chip light emitting device according to various embodiments of the present invention. As shown in FIG. 3, these devices 30 may include an active region 11, a P—GaN-based layer 12, a reflective metal layer 14, a barrier layer 15, a bonding layer 16 and a carrier 17, as was described above in connection with FIG. 1. The active region 11 also may generally include a multi-quantum well (MQW) structure that includes indium gallium nitride-based wells and gallium nitride-based barriers. A binary indium nitride layer 33 is provided directly on the gallium nitride-based outer layer 12. Moreover, the reflective metal layer 14 is provided directly on the binary indium nitride layer 33 opposite the gallium nitride-based outer layer 12. A separate ohmic metal layer 13 is not provided. However, in other embodiments, an ohmic metal layer may be provided to further decrease the forward voltage. The active region 11, the outer layer 12 and the binary indium nitride layer 33 may be fabricated as an LED epitaxial structure 38.

Still referring to FIG. 3, an N-type gallium nitride-based layer 18 may be provided on the active region 11 opposite the P—GaN-based layer 12, and may also be included as part of the LED epi structure 38. The N—GaN-based layer 18 may be provided on a substrate 19, which may comprise silicon carbide, sapphire and/or other transparent substrates. The substrate 19 is shown in dashed line because it can be removed after forming the LED epi structure 38 on the substrate 19, so that it need not be present in the final structure.

Moreover, when the N—GaN-based layer 18 and/or the substrate 19 are included, one or more surfaces thereof may be roughened to allow improved light extraction. Thus, the interface between the N—GaN-based layer 18 and the substrate 19 may be nonplanar (e.g., textured and/or roughened)

and/or the outer surface of the substrate 19 remote from the N—GaN-based layer 18 may be nonplanar. Nonplanar surfaces may be provided by adjusting growth parameters and/or by texturing/roughening a planar surface after it is grown.

Figure 4:
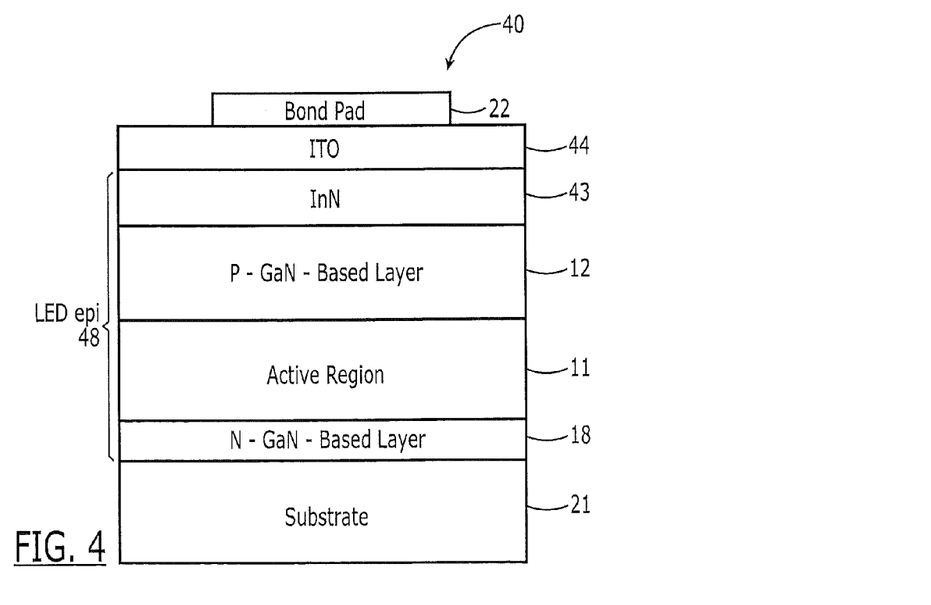
FIGS. 4, 6 and 7 are cross-sectional views of non-flip-chip light emitting devices according to various embodiments of the present invention.

FIG. 4 illustrates a non-flip-chip LED according to various embodiments of the present invention. As shown in FIG. 4, these non-flip-chip LEDs 40 may include a substrate 21, an active region 11, an N—GaN-based layer 18, an outer layer 12 and a bond pad 22, as was described above in connection with FIG. 2. However, a binary indium nitride layer 43 is provided directly on the P—GaN-based outer layer 12. Moreover, a transparent conductive oxide layer 44, such as indium tin oxide (ITO), is provided directly on the binary indium nitride layer 43 opposite the outer layer 12, to provide the requisite current spreading. A separate ohmic metal layer 13 is not provided. However, it may be provided in other embodiments. The active region 11, the GaN-based layers 12 and 13, and the binary indium nitride layer 43 may be fabricated as an LED epitaxial structure 48.

The binary indium nitride layer 33 and/or 43 of FIGS. 3 and/or 4, respectively, can provide a lower bandgap than the outer P—GaN-based layer 12 of these figures, and can also provide relatively low resistivity, to thereby provide a good ohmic contact.

Additional discussion of the binary indium nitride layers 33, 43 will now be provided. In some embodiments, these layers are undoped, i.e., not intentionally doped. These layers may have a thickness of between about 5 Å and about 100 Å, and, in some embodiments, about 20 Å. In other embodiments, the binary indium nitride layer 33, 43 may be intentionally doped N-type or P-type. These layers may typically be N-type as grown. However, N-type dopants, such as silicon, may also be used. For P-type layers, magnesium (Mg) may be used as a dopant. However, magnesium doped layers may also be N-type if the amount of magnesium is not sufficient for the layer to be P-type. The binary indium nitride layer 33, 43 may be grown at the same conditions as wells in the active region 11. The binary indium nitride-based layer may be pit-free or may manifest pits as measured by an atomic force microscope or scanning electron microscope.

Moreover, in FIG. 3, the reflective metal layer 14 may be deposited so that it is ohmic in its as-deposited state. For example, electron beam deposition and/or sputter deposition may be used. Alternatively, the reflective metal 14 may be non-ohmic as deposited and then may be annealed, for example between about 200° C. and about 700° and, in some embodiments, at about 300° C., for between about 1 minute and 30 minutes, and, in some embodiments, for about 15 minutes, to make the reflective metal 14 ohmically contact the binary indium nitride layer 33.

Figure 5:
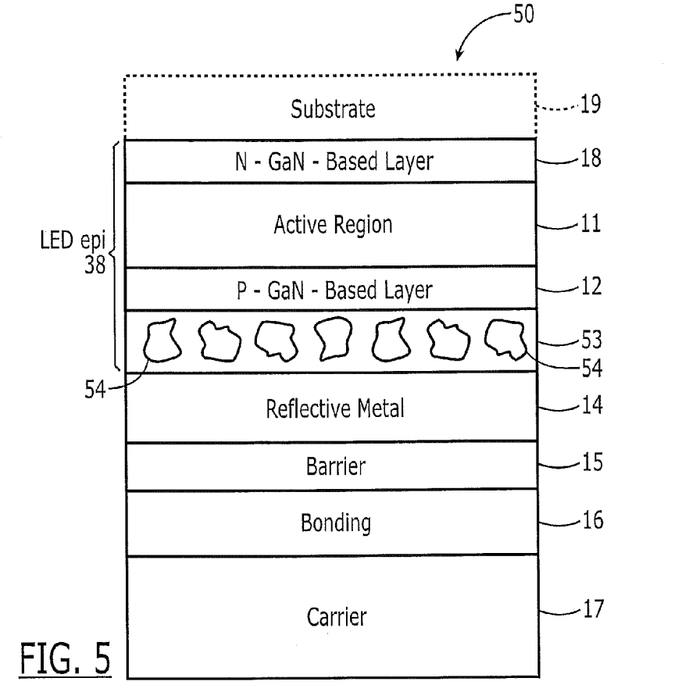
Figure 6:
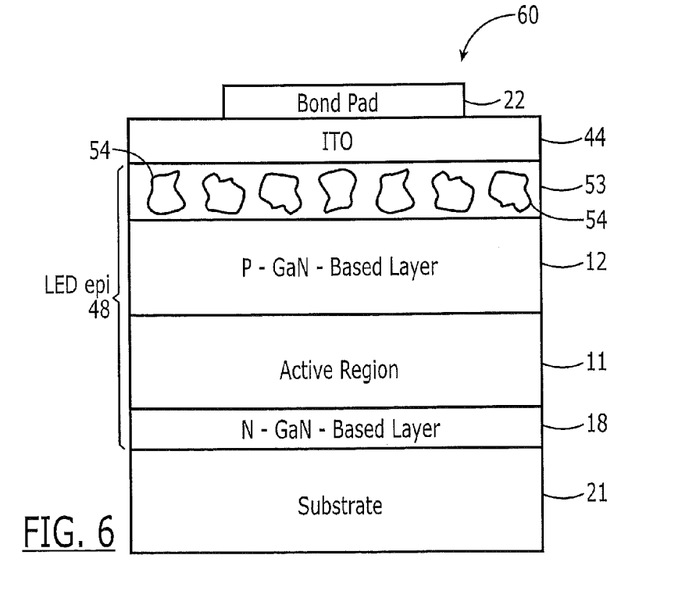

FIGS. 5 and 6 illustrate other flip-chip and non-flip-chip embodiments of the present invention, respectively. In FIGS. 5 and 6, these LEDs 50 and 60 include an indium gallium nitride-based layer 53 that includes therein clusters 54 of elemental indium and/or binary indium nitride. Growth conditions may be controlled, for example by decreasing the growth temperature to less than about 750° C., to provide an indium gallium nitride-based layer 53 with clusters 54 of elemental indium and/or binary indium nitride therein. These clusters 54 may be of average size of less than about 100 Å, and, in some embodiments, less than about 50 Å in diameter. These clusters 54 may have even lower bandgaps, such as a bandgap of less than about 1 eV, and in some embodiments, of about 0.7 eV, and may provide conductive paths that can further reduce overall forward voltage. These layers may also have an indium composition of between about 5 atomic percent and about 30 atomic percent. Other parameters of the indium gallium nitride-based layer 53 may be as was described above for layers 33 and/or 43.

It will also be understood that other embodiments of FIGS. 5 and 6 need not provide the indium gallium nitride-based layer 53 including therein clusters 54 of elemental indium and/or binary indium nitride directly on a binary gallium nitride layer 12 or directly on an active region 11. Moreover, still other embodiments of FIGS. 5 and 6 need not provide the reflective metal layer 14 or the ITO layer 44 directly on the indium gallium nitride-based layer 53 including therein clusters 54 of elemental indium and/or binary indium nitride.

Figure 7:
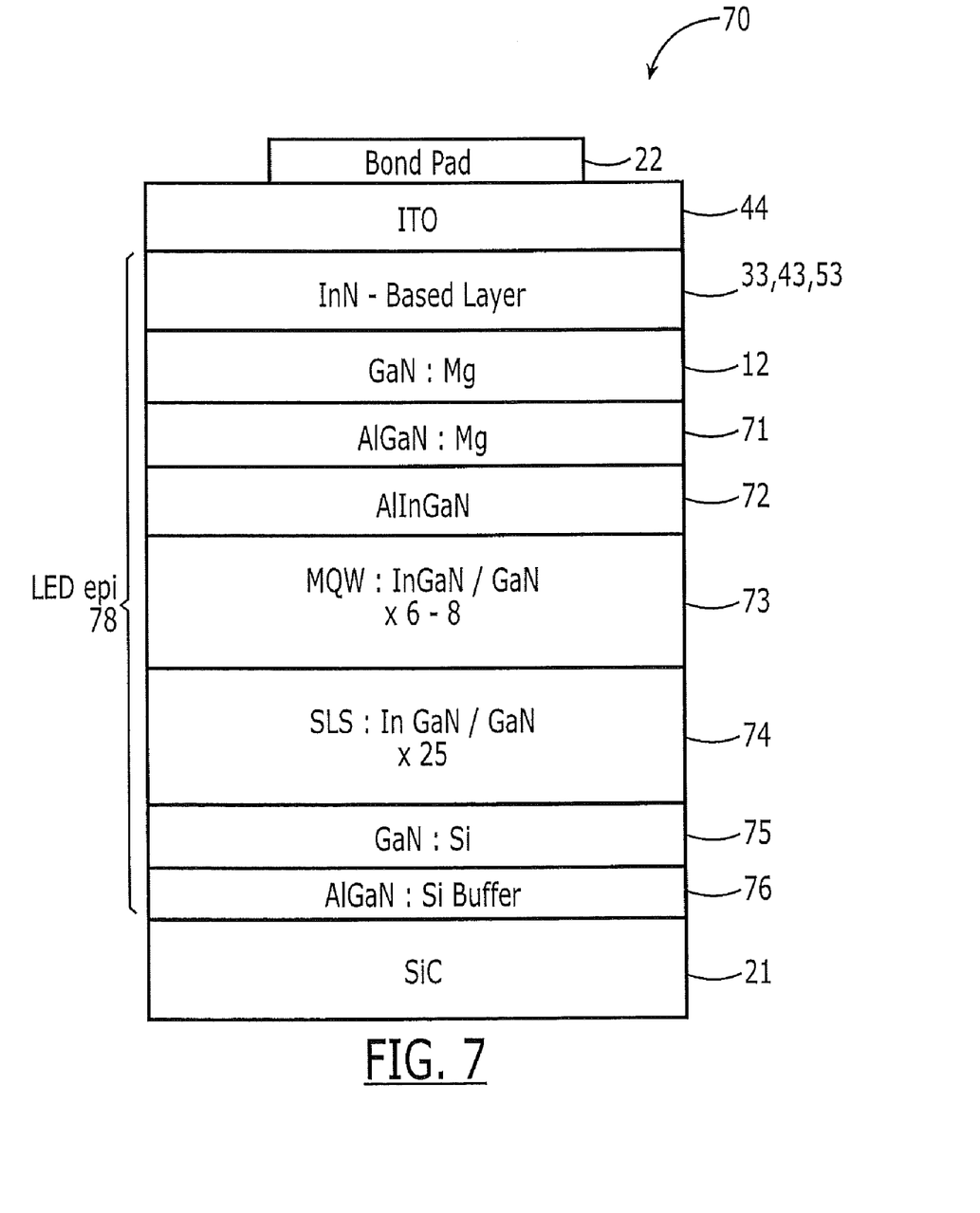

FIG. 7 is a cross-sectional view of non-flip-chip LEDs according to other embodiments of the present invention. These non-flip-chip LEDs 70 include a silicon carbide substrate 21 that may be 4H or 6H N-type silicon carbide. In other embodiments, the substrate 21 can include sapphire, bulk gallium nitride, bulk aluminum nitride or other suitable substrates. In some embodiments, the substrate 21 can be a growth substrate on which the epitaxial layers 78 forming the LED structure 70 are formed. In other embodiments, the substrate 21 can be a carrier substrate to which the epitaxial layers 78 are transferred. In other embodiments, the substrate 21 can be removed altogether, as is understood in the art.

Still referring to FIG. 7, the LED epi structure 78 includes a silicon doped binary GaN layer 75 on the substrate 21. One or more buffer layers 76, such as a silicon doped ternary aluminum gallium nitride buffer layer, may be provided between the substrate 21 and the binary GaN layer 75. An N-type superlattice (SLS) structure 74 can be formed on the binary GaN layer 75. For example, 25 repetitions of ternary indium gallium nitride/binary gallium nitride may be provided. A multi-quantum well (MQW) 73 may be formed on the superlattice 74. In some embodiments, the MQW may comprise 6 to 8 repetitions of ternary indium gallium nitride/binary gallium nitride. An undoped quaternary aluminum indium gallium nitride layer 72 may be formed on the MQW 73, and a ternary aluminum gallium nitride layer 71 doped with a P-type dopant, such as magnesium, may be formed on the quaternary aluminum indium gallium nitride layer 72. A gallium nitride-based layer, such as a binary gallium nitride layer 12 also doped with a P-type dopant, such as magnesium, may be formed on the ternary aluminum gallium nitride layer 71. The active region of the device 70 may include the GaN:Si layer 75, the superlattice 74 and the multi-quantum well 73. An InN-based layer 33, 43, 53 is provided on the GaN-based layer 12 as was described above. An ITO layer 44 and a bond pad 22 are provided as was described above.

Figure 8:
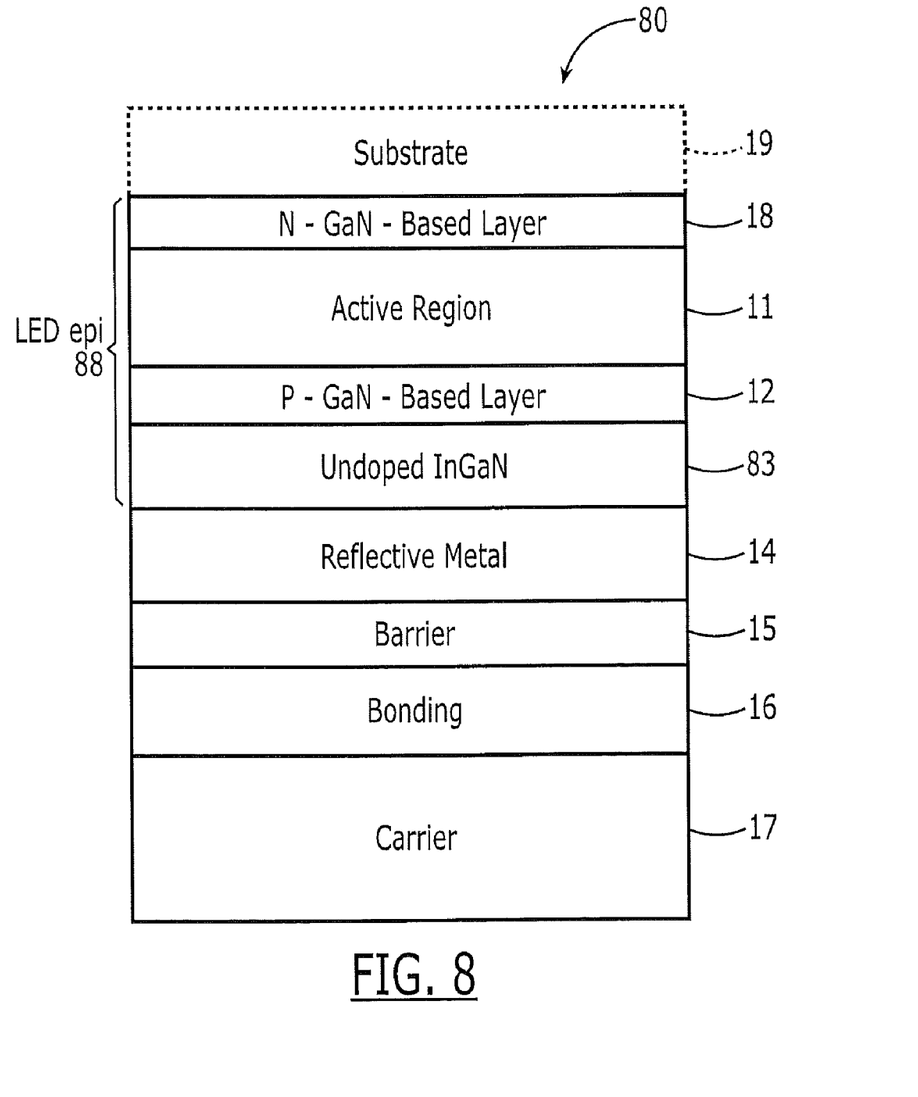
FIGS. 8, 9, 10, 11 and 12 are cross-sectional views of flip-chip light emitting devices according to various other embodiments of the present invention mounted on carriers, such as submounts.

FIG. 8 is a cross-sectional view of a flip-chip light emitting device according to other embodiments of the present invention. As shown in FIG. 8, these devices 80 may include an active region 11, a P—GaN-based outer layer 12, a reflective metal layer 14, a barrier layer 15, a bonding layer 16 and a carrier 17, as was described above, for example, in connection with FIG. 3. An N—GaN-based layer 18 and/or a substrate 19 also may be provided. An undoped indium gallium nitride-based layer 83 is provided directly on the gallium nitride-based outer layer 12. Moreover, the reflective metal layer 14 is provided directly on the undoped indium gallium nitride-based layer 83. A separate ohmic metal layer 13 is not provided, although it may be provided in other embodiments. The active region 11, the outer layer 12, and the undoped indium gallium nitride-based layer 83 may be fabricated as an LED epitaxial structure 88.

More specifically, the indium gallium nitride-based layer 83 may have a thickness of between about 5 Å and about 100 Å in some embodiments, and, in some embodiments, may be about 20 Å thick. An indium composition of about 5 atomic percent to about 30 atomic percent may be provided, and, in some embodiments, about 10 atomic percent indium may be provided. In other embodiments, the indium composition in the indium gallium nitride-based layer 83 may be equal to or greater than the indium composition of the wells of the active region 11. Moreover, the indium gallium nitride-based layer 83 may be undoped, i.e., not intentionally doped. More specifically, N- and P-doping sources may not be used during the epitaxial growth of the indium gallium nitride-based layer 83. It will be understood that some dopants may still be found in the indium gallium nitride-based layer 83 due to, for example, residual dopants in the epitaxial system, so that an actual doping of magnesium from about $1\times10^{15}$ cm$^{-3}$ to about $1\times10^{22}$ cm$^{-3}$ may be present in some embodiments, and, in some embodiments, a magnesium doping level of about $1\times10^{17}$ cm$^{-3}$ may be found. In other embodiments, the layer 83 may be intentionally doped N- or P-type.

The undoped indium gallium nitride-based layer 83 may be fabricated directly on the P—GaN-based outer layer 12 by continuing to expose the LED epi structure 88 to a source of gallium and a source of nitrogen while turning on the source of indium and also turning off the source of magnesium or other P-type dopants.

The indium gallium nitride-based layer 83 may further act to decrease the bandgap, without being unduly absorptive. Accordingly, the thickness and/or indium content of the indium gallium nitride-based layer 83 may be selected to provide acceptable electrical conduction without excessively absorbing emitted radiation from the active region 11. Accordingly, in some embodiments, an indium gallium nitride layer that is about 20 Å in thickness, having about 10 atomic percent weight indium and not being intentionally doped may satisfy these criteria. In other embodiments, the indium gallium nitride-based layer 83 may be made even thinner, so as to not be unduly absorptive, even though higher indium content than the indium gallium nitride quantum wells of the active region is provided. Thus, if the indium gallium nitride wells of the active region 11 have an indium content of between about 20% and 40%, an even higher indium content may be provided in the undoped indium gallium nitride-based layer 83, provided that this layer is sufficiently thin so as to not excessively absorb emitted radiation from the active region.

Figure 9:
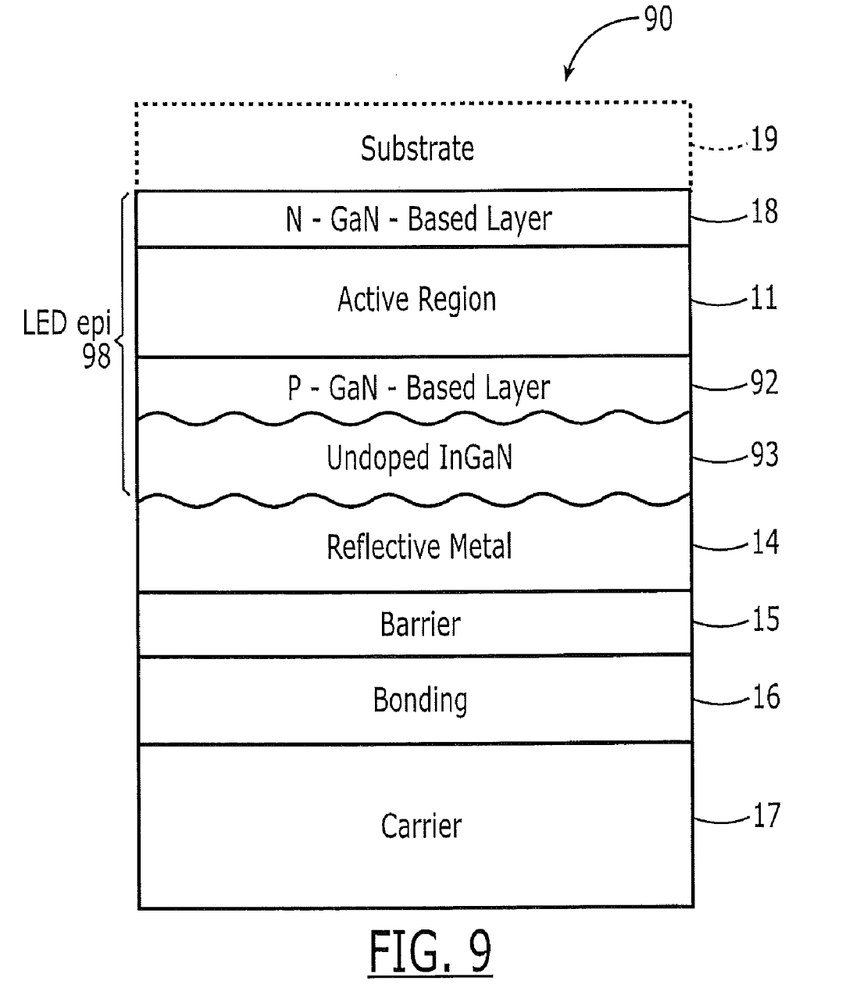

FIG. 9 is a cross-sectional view of a flip-chip light emitting device according to still other embodiments of the present invention. These devices 90 may be similar to devices 80 of FIG. 8, except that the LED epi structure 98 includes a P—GaN-based layer 92 that has a nonplanar (e.g., roughened or textured) surface, illustrated by a wavy line in FIG. 9, and the undoped indium gallium nitride-based layer 93 is also nonplanar. Thus, a conformal nonplanar layer of undoped indium gallium nitride-based material 93 may be provided on the nonplanar surface of the P—GaN-based layer 92. It will be understood that in FIG. 9, the thicknesses of the layers are not drawn to scale, and that layer 93 is typically much thinner than layer 92, so that layer 93 may be regarded as a thin conformal coating on P—GaN-based layer 92. The nonplanar surface of P—GaN-based layer 92 may enhance extraction of light, and the provision of the nonplanar undoped InGaN layer 93 may compensate for the voltage drop that may otherwise be presented by the P—GaN-based outer layer 92. Accordingly, improved light extraction may be obtained without the need to pay a voltage penalty. It will be understood that the nonplanar layers 12 and/or 93 may be grown in a nonplanar form by adjusting the growth parameters and/or planar layers may be nonplanarized or further nonplanarized after growth.

Figure 10:
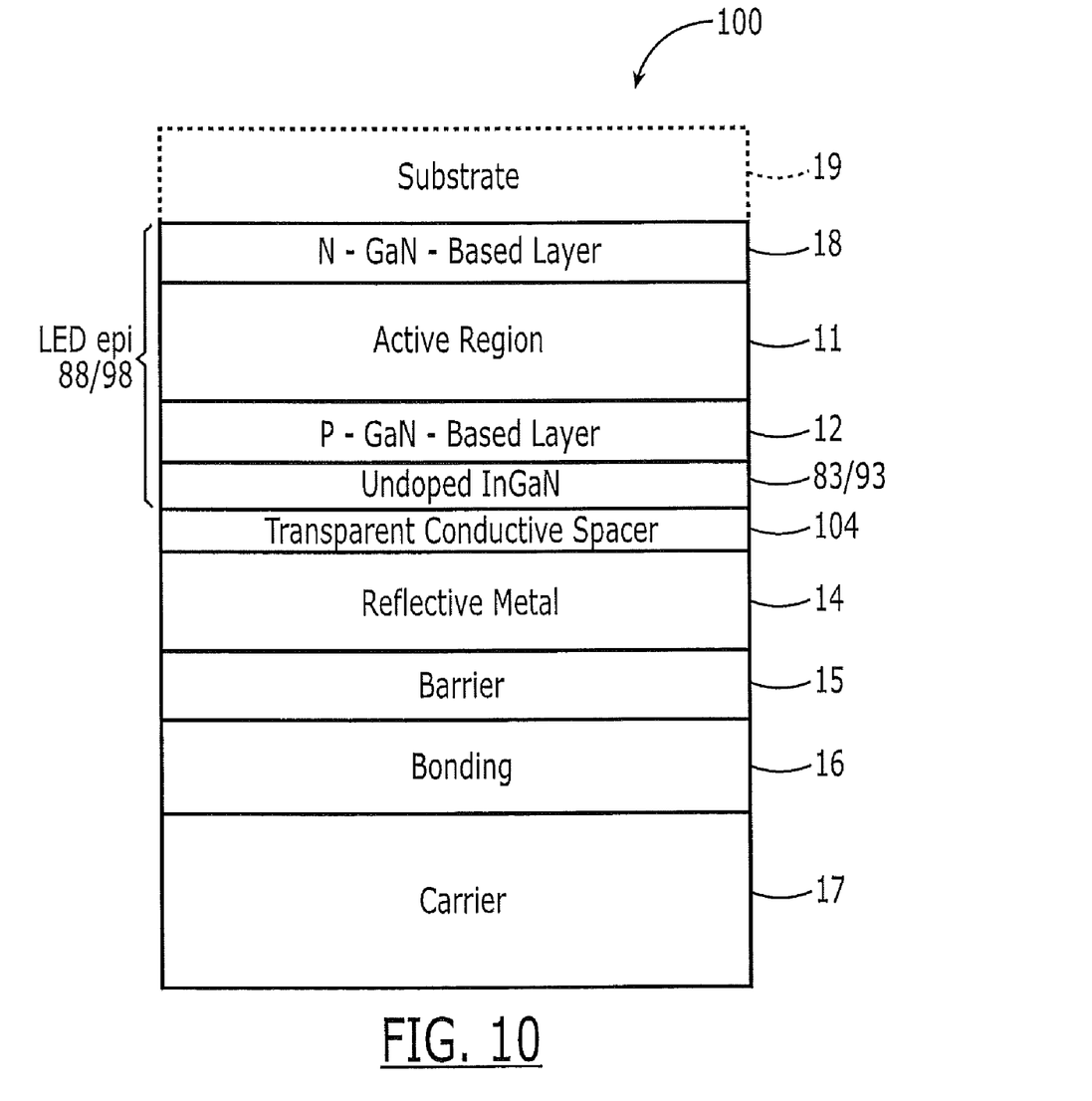

FIG. 10 is a cross-sectional view of a flip-chip light emitting device according to still other embodiments of the present invention. As shown in FIG. 10, these devices 100 may include an LED epi region 88/98, as was described above in connection with FIGS. 8 and/or 9. However, a transparent conductive spacer 104 is added directly on the undoped InGaN-based layer 83/93, and the reflective metal layer 14 is provided directly on the transparent conductive spacer 104. The transparent conductive spacer 104, which may comprise a transparent conductive oxide layer, such as indium tin oxide (ITO), zinc oxide (ZnO), or nickel oxide (NiO), having a thickness of between about 5 Å and about 5,000 Å may be provided.

The transparent conductive spacer layer 104 may perform a unique function in embodiments of FIG. 10. Typically, transparent conductive oxides are used to provide current spreading, while allowing light to pass therethrough. However, in embodiments of FIG. 10, current spreading may not be needed, because the undoped InGaN-based layer 83/93 provides a good ohmic contact. Nonetheless, by providing a transparent conductive layer 104, the efficiency of the reflective metal layer 14 may be increased and, in some embodiments, optimized, by providing a desired, and in some embodiments optimum, spacing between the active region 11 and the reflective metal layer 14.

Stated differently, by moving the reflective metal 14 further away from the active region 11, an increased, and in some embodiments maximized, percentage of reflection may be provided. The thickness of the transparent conductive layer may selected based on the distance between the active region 11 and the reflective metal layer 14, the composition of the reflective metal layer 14, the frequency of light that is being emitted by the active region 11 and/or other parameters, to increase or maximize the reflection from the reflective metal layer 14. In some embodiments, the spacing may be selected as a function of the wavelength of the light, to reduce destructive interference between the incoming and reflected light, and thereby provide enhanced or maximum reflected light. In some embodiments, a spacing of one quarter the wavelength of light, or multiples of one quarter the wavelength of the emitted light, may be used. Thus, a transparent conductive oxide, such as ITO, may be used as a transparent conductive spacer in a flip-chip LED, to enhance the efficiency of the reflective metal layer 14. It will be understood that embodiments of FIG. 10 may be used in combination with the nonplanar P—GaN layer 92 and nonplanar undoped InGaN layer 93 of FIG. 9.

Figure 11:
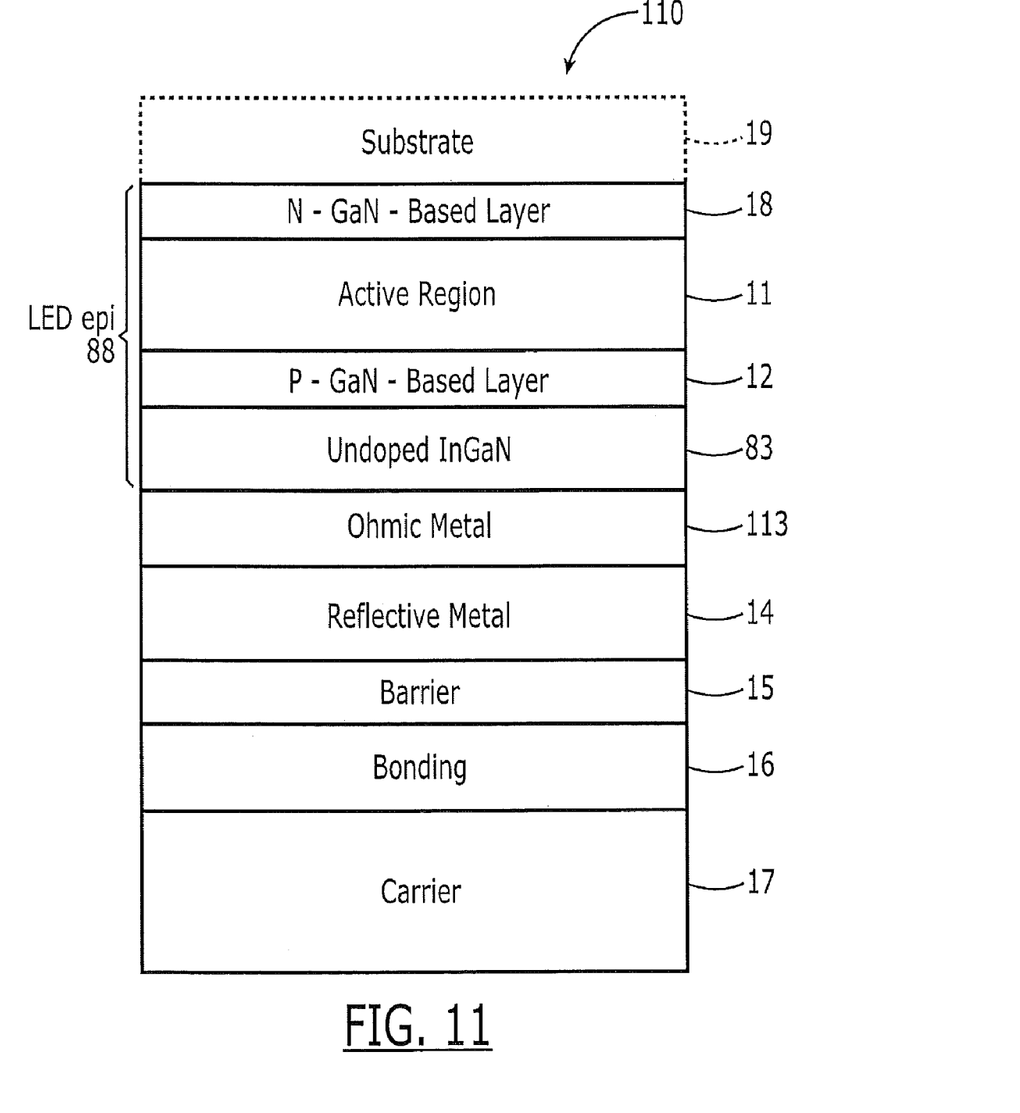
Figure 12:
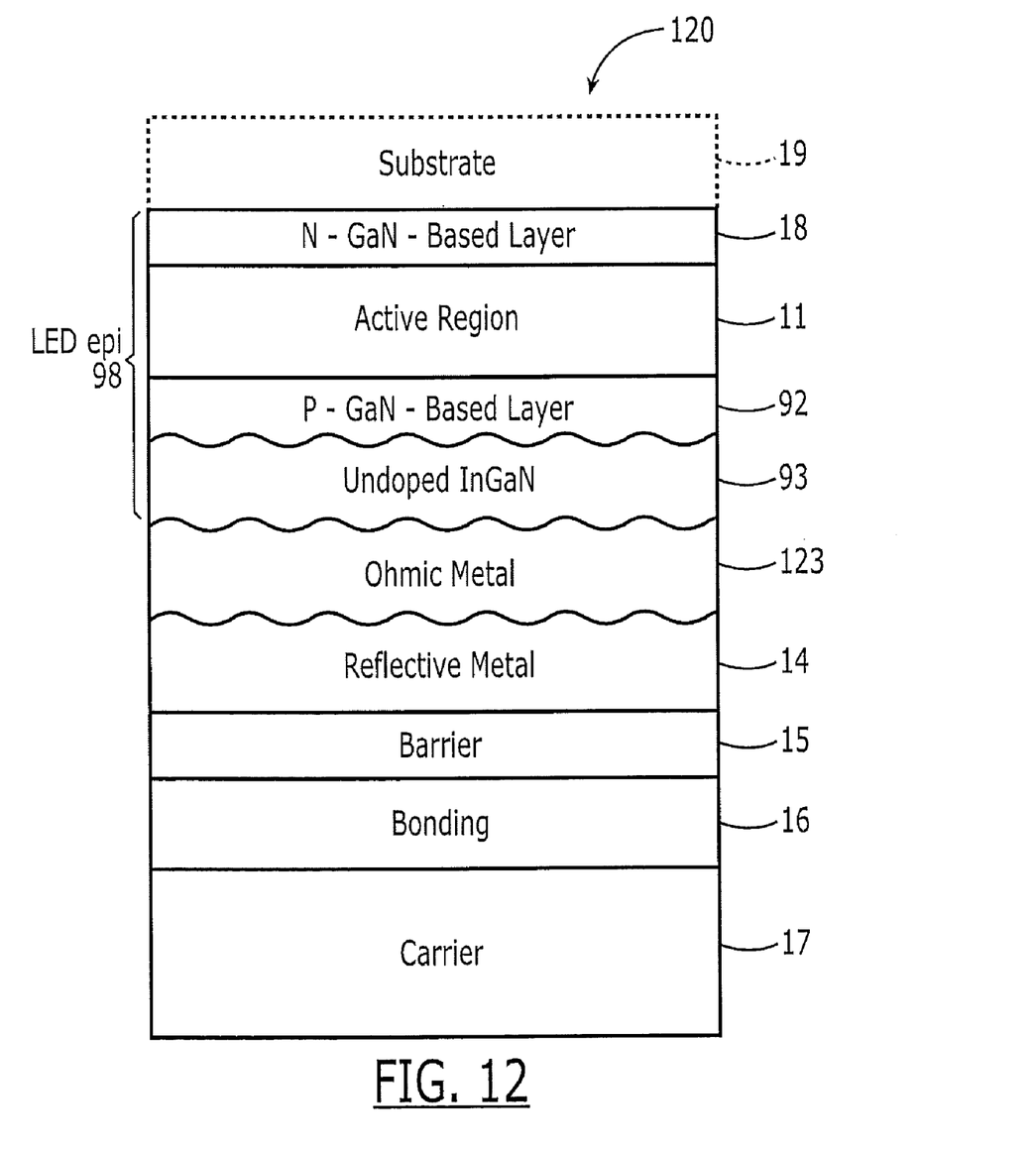

FIGS. 11 and 12 are cross-sectional views of flip-chip light emitting devices according to yet other embodiments of the invention. The devices 110 of FIG. 11 may be similar to devices 80 of FIG. 8, and the devices 120 of FIG. 12 may be similar to the devices 90 of FIG. 9, except that an ohmic metal layer 113, 123, respectively, is added between the undoped InGaN layer 83/93, and the reflective metal layer 14. The ohmic metal layer 113/123 may comprise nickel. As shown in embodiments of FIGS. 11 and 12, the addition of an ohmic metal layer may further decrease the forward voltage of the light emitting device when used in combination with the undoped InGaN layer 83/93.

Embodiments of the invention have been described above in connection with light emitting devices. However, ohmic contact structures as described herein may also be used for gallium nitride-based devices that are not light emitting. For example, contact structures as described herein may be used in connection with gallium nitride-based High Electron Mobility Transistor (HEMT) devices. In HEMT devices, layers 12 and 33 of FIG. 3 may be used on an active HEMT region and layers 12 and 53 of FIG. 5 may be used on an active HEMT region. Accordingly, gallium nitride-based devices that are not light emitting may also be provided according to other embodiments of the present invention.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A light emitting device comprising:
a gallium nitride-based epitaxial structure that includes an active light emitting region and a gallium nitride-based outer layer;
an undoped indium gallium nitride-based layer directly on the gallium nitride-based outer layer;
an ohmic metal layer directly on the undoped indium gallium nitride-based layer opposite the gallium nitride-based outer layer; and
a reflective metal layer directly on the ohmic metal layer opposite the undoped indium gallium nitride-based layer.

2. A light emitting device according to claim 1 wherein the gallium nitride-based layer is doped P-type.

3. A light emitting device according to claim 1 wherein the reflective metal layer comprises silver, nickel-silver alloy and/or aluminum.

4. A light emitting device according to claim 1 wherein the ohmic metal layer comprises nickel.

5. A light emitting device according to claim 1 wherein the undoped indium gallium nitride-based layer is between about 5 Å and about 100 Å thick.

6. A light emitting device according to claim 1 wherein the gallium nitride-based outer layer includes a nonplanar outer surface and wherein the undoped indium gallium nitride-based layer is also nonplanar.

7. A light emitting device according to claim 1 further comprising a barrier layer on the reflective metal layer opposite the undoped indium gallium nitride-based layer and a bonding layer on the barrier layer opposite the reflective metal layer.

8. A light emitting device according to claim 1 further comprising a substrate on the gallium nitride-based epitaxial structure opposite the outer layer.

9. A semiconductor device comprising:
a gallium nitride-based epitaxial structure that includes a gallium nitride-based outer layer;
a binary indium nitride layer directly on the gallium nitride-based outer layer; and
a substrate on the gallium nitride-based epitaxial structure opposite the outer layer.

10. A device according to claim 9 wherein the gallium nitride-based outer layer is doped P-type.

11. A semiconductor device comprising:
a gallium nitride-based epitaxial structure that includes a gallium nitride-based outer layer; and
a binary indium nitride layer directly on the gallium nitride-based outer layer,
wherein the gallium nitride-based epitaxial structure includes an active High Electron Mobility Transistor (HEMT) region.

12. A semiconductor device comprising:
a gallium nitride-based epitaxial structure; and
an indium gallium nitride-based layer including therein clusters of elemental indium and/or binary indium nitride, on the gallium nitride-based epitaxial structure.

13. A light emitting device according to claim 12 wherein the indium gallium nitride-based layer including therein clusters of elemental indium and/or binary indium nitride is directly on the gallium nitride-based epitaxial structure.

14. A light emitting device according to claim 12 wherein indium gallium nitride-based layer including therein clusters of elemental indium and/or binary indium nitride is a ternary indium gallium nitride layer including therein clusters of elemental indium and/or binary indium nitride.

15. A light emitting device according to claim 12 further comprising a substrate on the gallium nitride-based epitaxial structure opposite the indium gallium nitride-based layer.

16. A device according to claim 12 wherein the gallium nitride-based epitaxial structure includes an active High Electron Mobility Transistor (HEMT) region.

* * * * *